US006955868B2

(12) United States Patent
Choi et al.

(10) Patent No.: US 6,955,868 B2
(45) Date of Patent: Oct. 18, 2005

(54) METHOD TO CONTROL THE RELATIVE POSITION BETWEEN A BODY AND A SURFACE

(75) Inventors: Byung Jin Choi, Round Rock, TX (US); Sidlgata V. Sreenivasan, Austin, TX (US); Stephen C. Johnson, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 28 days.

(21) Appl. No.: 10/785,248

(22) Filed: Feb. 24, 2004

(65) Prior Publication Data

US 2005/0089774 A1 Apr. 28, 2005

Related U.S. Application Data

(62) Division of application No. 09/698,317, filed on Oct. 27, 2000.
(60) Provisional application No. 60/162,392, filed on Oct. 29, 1999.

(51) Int. Cl.[7] .................... G03F 9/00
(52) U.S. Cl. .................... 430/22; 430/30; 355/72; 396/428
(58) Field of Search .................... 430/22, 30; 355/18, 355/72; 396/428

(56) References Cited

U.S. PATENT DOCUMENTS

| | | |
|---|---|---|
| 3,783,520 A | 1/1974 | King |
| 4,070,116 A | 1/1978 | Frosch et al. |
| 4,119,688 A | 10/1978 | Hiraoka |
| 4,201,800 A | 5/1980 | Alcorn et al. |
| 4,426,247 A | 1/1984 | Tamamura et al. |
| 4,507,331 A | 3/1985 | Hiraoka |
| 4,552,833 A | 11/1985 | Ito et al. |

(Continued)

FOREIGN PATENT DOCUMENTS

| | | |
|---|---|---|
| JP | 55-88332 | 12/1978 |
| JP | 57-7931 | 1/1982 |
| JP | 63-138730 | 12/1986 |
| JP | 02-24848 | 1/1990 |
| JP | 02-92603 | 4/1990 |
| WO | WO 00/21689 | 4/2000 |
| WO | WO 01/47003 A2 | 6/2001 |

OTHER PUBLICATIONS

Abstract of Japanese Patent 63–138730.
Abstract of Japanese Patent 55–88332.
Abstract of Japanese Patent 57–7931.
Abstract of Japanese Patent 02–92603.
Translation of Japanese Patent 02–92603.
Abstract of Japanese Patent 02–24848.
Translation of Japanese Patent 02–24848.

Heidari et al., "Nanoimprint Lithography at the 6 in. Water Scale," Journal of Vacuum Science Technology, Nov./Dec. 2000, pp. 3557–3560, vol. B, No. 18(6)/.
Nerac.com Retro Search, "Reduction of Dimension of Contact Holes", Aug. 31, 2004.
Nerac.com Retro Search, "Trim Etching of Features Formed on an Organic Layer", Sep. 2, 2004.
Nerac.com Retro Search, "Multi–Layer Resists", Sep. 2, 2004.
Hu et al., "Flourescence Probe Technicques (FPT) for Measuring the Relative Efficiencies of Free–Radical Photoinitiators", s0024–9297(97)01390–9;"Macromolecules" 1998, vol. 31, No. 13, pp. 4107–4113, 1998 American Chemical Society, Published on Web May 29, 1998.
Feynman, Richard P., "There's Plenty of Room at the Bottom—An Invitation to Enter a New Field of Physics," 12 pp [online[Retrieved Sep. 23, 2004 from URI:http//www.zyvex.com/nanotech/feynman.html.
Ciba Speciality Chemicals Business Line Coatings, "What is UV Curing?", 45 pp [online[Retrieved Sep. 24, 2004 from URL:http//www.cibasc.com/image.asp?id=4040.
Communication Relating to the Results of the Partial International Search; International Appl. No. PCT/US2002/015551.
Papier et al., "The Graftijng of Perfluorinated Silanes onto the Surface of Silica: Characterization by Inverse Gas Chromatography," Aug. 1993, pp238–242, vol. 159, Issue 1.
Abstract of Papier et al., "The Graftijng of Perfluorinated Silanes onto the Surface of Silica: Characterization by Inverse Gas Chromatography," Aug. 1993, pp238–242, vol. 159, Issue 1.
Hirai et al., "Mold Surface Treatment for Imprint Lithography," Aug. 2001, pp 457–462, vol. 14, No. 3.
Abstract of Hirai et al., "Mold Surface Treatment for Imprint Lithography," Aug. 2001, pp 457–462, vol. 14, No. 3.
Sung et al., "Micro/nano–tribological Characteristics of Self–Assembled Monoloayer and its Application in Nano–Structure Fabrication," Jul. 2003, pp. 808–818, vol. 255, No. 7.
Abstract of Sung et al., "Micro/nano–tribological Characteristics of Self–Assembled Monoloayer and its Application in Nano–Structure Fabrication," Jul. 2003, pp. 808–818, vol. 255, No. 7.
Roos et al, "Nanoimprint Lithography with a Commerical 4 Inch Bond System for Hot Embossing," Oct. 2001, pp. 427–435, vol. 4343.
Abstract of Roos et al, "Nanoimprint Lithography with a Commerical 4 Inch Bond System for Hot Embossing," Oct. 2001, pp. 427–435, vol. 4343.

*Primary Examiner*—Christopher G. Young
(74) *Attorney, Agent, or Firm*—Kenneth C. Brooks

(57) ABSTRACT

A method to control a relative position between a surface and a body to form a pattern in the surface that features moving a body to obtain a desired relationship between the surface and the body. To that end, the method includes sensing the surface and the body and moving that body to obtain a desired spatial relationship with the surface.

21 Claims, 14 Drawing Sheets

U.S. PATENT DOCUMENTS 4,600,309 A 7/1986 Fay
4,657,845 A 4/1987 Frechet et al.
4,692,205 A 9/1987 Sachdev et al.
4,707,218 A 11/1987 Giammarco et al.
4,737,425 A 4/1988 Lin et al.
4,808,511 A 2/1989 Holmes
4,826,943 A 5/1989 Ito et al.
4,848,911 A 7/1989 Uchida et al.
4,857,477 A 8/1989 Kanamori
4,891,303 A 1/1990 Garza et al.
4,908,298 A 3/1990 Hefferon et al.
4,919,748 A 4/1990 Bredbenner et al.
4,921,778 A 5/1990 Thackeray et al.
4,931,351 A 6/1990 McColgin et al.
4,964,945 A 10/1990 Calhoun
4,976,818 A 12/1990 Hashimoto et al.
4,980,316 A 12/1990 Huebner
4,999,280 A 3/1991 Hiraoka
5,053,318 A 10/1991 Gulla et al.
5,071,694 A 12/1991 Uekita et al.
5,074,667 A 12/1991 Miyatake
5,108,875 A 4/1992 Thackeray et al.
5,148,036 A 9/1992 Matsugu et al.
5,148,037 A 9/1992 Suda et al.
5,151,754 A 9/1992 Ishibashi et al.
5,169,494 A 12/1992 Hashimoto et al.
5,173,393 A 12/1992 Sezi et al.
5,179,863 A 1/1993 Uchida et al.
5,198,326 A 3/1993 Hashimoto et al.
5,212,147 A 5/1993 Sheats
5,234,793 A 8/1993 Sebald et al.
5,240,878 A 8/1993 Fitzsimmons et al.
5,242,711 A 9/1993 DeNatale et al.
5,244,818 A 9/1993 Jokerst et al.
5,314,772 A 5/1994 Kozicki et al.
5,318,870 A 6/1994 Hartney
5,324,683 A 6/1994 Fitch et al.
5,328,810 A 7/1994 Lowrey et al.
5,330,881 A 7/1994 Sidman et al.
5,362,606 A 11/1994 Hartney et al.
5,366,851 A 11/1994 Novembre
5,374,454 A 12/1994 Bickford et al.
5,376,810 A 12/1994 Hoenk et al.
5,380,474 A 1/1995 Rye et al.
5,417,802 A 5/1995 Obeng
5,421,981 A 6/1995 Leader et al.
5,422,295 A 6/1995 Choi et al.
5,424,549 A 6/1995 Feldman
5,431,777 A 7/1995 Austin et al.
5,439,766 A 8/1995 Day et al.
5,453,157 A 9/1995 Jeng
5,458,520 A 10/1995 DeMercurio et al.
5,468,542 A 11/1995 Crouch
5,527,662 A 6/1996 Hashimoto et al.
5,654,238 A 8/1997 Cronin et al.
5,670,415 A 9/1997 Rust
5,700,626 A 12/1997 Lee et al.
5,736,424 A 4/1998 Prybyla et al.
5,743,998 A 4/1998 Park
5,855,686 A 1/1999 Rust
5,895,263 A 4/1999 Carter et al.
5,907,782 A 5/1999 Wu
5,926,690 A 7/1999 Toprac et al.
5,948,219 A 9/1999 Rohner
5,948,570 A 9/1999 Kornblit et al.
6,033,977 A 3/2000 Gutsche et al.
6,035,805 A 3/2000 Rust
6,096,655 A 8/2000 Lee et al.
6,150,231 A 11/2000 Muller et al.
6,150,680 A 11/2000 Eastman et al.
6,190,929 B1 2/2001 Wang et al.
6,245,581 B1 6/2001 Bonser et al.
6,274,294 B1 8/2001 Hines
6,326,627 B1 12/2001 Putvinski et al.
6,329,256 B1 12/2001 Ibok
6,383,928 B1 5/2002 Eissa
6,387,783 B1 5/2002 Furukawa et al.
6,388,253 B1 5/2002 Su
6,391,798 B1 5/2002 DeFelice et al.
6,411,010 B1 * 6/2002 Suzuki et al. .......... 310/323.17
6,455,411 B1 9/2002 Jiang et al.
6,482,742 B1 11/2002 Chou
6,489,068 B1 12/2002 Kye
6,514,672 B2 2/2003 Young et al.
6,534,418 B1 3/2003 Plat et al.
6,541,360 B1 4/2003 Plat et al.
6,561,706 B2 5/2003 Singh et al.
6,565,928 B2 5/2003 Sakamoto et al.
6,632,742 B2 10/2003 Yang et al.
6,635,581 B2 10/2003 Wong
6,646,662 B1 11/2003 Nebashi et al.
6,677,252 B2 1/2004 Marsh
6,703,190 B2 3/2004 Elian et al.
6,716,767 B2 4/2004 Shih et al.
6,730,256 B1 5/2004 Bloomstein et al.
6,737,202 B2 5/2004 Gehoski et al.
6,743,713 B2 6/2004 Mukherjee-Roy et al.
6,767,983 B1 7/2004 Fujiyama et al.
6,770,852 B1 8/2004 Steger
6,776,094 B1 8/2004 Whitesides et al.
6,777,170 B1 8/2004 Bloomstein et al.
2002/0098426 A1 * 7/2002 Sreenivasan et al. ......... 430/22
2002/0132482 A1 9/2002 Chou
2002/0167117 A1 11/2002 Chou
2003/0080471 A1 5/2003 Chou
2003/0081193 A1 5/2003 White et al.
2003/0113638 A1 6/2003 Mancini et al.
2003/0129542 A1 7/2003 Shih et al.
2004/0029041 A1 2/2004 Shih et al.
2004/0036201 A1 2/2004 Chou et al.

* cited by examiner

METHOD TO CONTROL THE RELATIVE POSITION BETWEEN A BODY AND A SURFACE

CLAIM TO PRIORITY

This application is a divisional patent application of U.S. patent application Ser. No. 09/698,317, filed Oct. 27, 2000 and entitled "High-Precision Orientation Alignment and Gap Control Stage for Imprint Lithography Processes," having Byung J. Choi, Sidlgata V. Sreenivasan, and Steven C. Johnson listed as inventors, which claims the benefit of provisional application Ser. No. 60/162,392, entitled "Method and Device for Precise Gap Control and Overlay Alignment During Semiconductor Manufacturing," filed Oct. 29, 1999, having Byung J. Choi, Sidlgata V. Sreenivasan, and Steven C. Johnson listed as inventors, both of the aforementioned patent applications being incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of N66001-98-18914 awarded by the Defense Advanced Research Projects Agency (DARPA).

TECHNICAL FIELD

The invention relates in general to techniques for small device manufacturing and specifically to a system, processes and related devices for high precision imprint lithography enabling the manufacture of extremely small features on a substrate, such as a semiconductor wafer. More specifically, the invention relates to methods and components for the orientation and the alignment of a template about a substrate, as well as their separation without destruction of imprinted features.

BACKGROUND OF THE INVENTION

Without limiting the invention, its background is described in connection with a process for the manufacture of sub-100 nm devices using imprint lithography.

In manufacturing, lithography techniques that are used for large-scale production include photolithography and other application oriented lithography techniques, such as electron beam lithography, ion-beam and x-ray lithography, as examples. Imprint lithography is a type of lithography that differs from these techniques. Recent research has shown that imprint lithography techniques can print features that are smaller than 50 nm. As such, imprint lithography has the potential to replace photolithography as the choice for semiconductor manufacturing in the sub-100 nm regime. It can also enable cost effective manufacturing of various kinds of devices, including patterned magnetic media for data storage, micro optical devices, MEMS, biological and chemical devices, X-ray optical devices, etc.

Current research in the area of imprint lithography has revealed a need for devices that can perform orientation alignment motions between a template, which contains the imprint image, and a substrate, which receives the image. Of critical importance is the careful and precise control of the gap between the template and the substrate. To be successful, the gap may need to be controlled within a few nanometers across the imprinting area, while, at the same time, relative lateral motions between the template and the substrate must be eliminated. This absence of relative motion leads is also preferred since it allows for a complete separation of the gap control problem from the overlay alignment problem.

For the specific purpose of imprinting, it is necessary to maintain two flat surfaces as close to each other as possible and nearly parallel. This requirement is very stringent as compared to other proximity lithography techniques. Specifically, an average gap of about 100 nm with a variation of less than 50 nm across the imprinted area is required for the imprint process to be successful at sub-100 nm scales. For features that are larger, such as, for example, MEMS or micro optical devices, the requirement is less stringent. Since imprint processes inevitably involve forces between the template and the wafer, it is also desirable to maintain the wafer surface as stationary as possible during imprinting and separation processes. Overlay alignment is required to accurately align two adjacent layers of a device that includes multiple lithographically fabricated layers. Wafer motion in the x-y plane can cause loss of registration for overlay alignment.

Prior art references related to orientation and motion control include U.S. Pat. No. 4,098,001, entitled "Remote Center Compliance System;" U.S. Pat. No. 4,202,107, entitled "Remote Axis Admittance System," both by Paul C. Watson; and U.S. Pat. No. 4,355,469, entitled "Folded Remote Center Compliant Device" by James L. Nevins and Joseph Padavano. These patents relate to fine decoupled orientation stages suitable for aiding insertion and mating maneuvers in robotic machines and docking and assembly equipment. The similarity between these prior art patents and the present invention is in the provision for deformable components that generate rotational motion about a remote center. Such rotational motion is generated, for example, via deformations of three cylindrical components that connect an operator and a subject in parallel.

The prior art patents do not, however, disclose designs with the necessary high stiffness to avoid lateral and twisting motions. In fact, such lateral motion is desirable in automated assembly to overcome mis-alignments during the assembly process. Such motion is highly undesirable in imprint lithography since it leads to unwanted overlay errors and could lead to shearing of fabricated structures. Therefore, the kinematic requirements of automated assembly are distinct from the requirements of high precision imprint lithography. The design shown in U.S. Pat. No. 4,355,469 is intended to accommodate larger lateral and rotational error than the designs shown in the first two patents, but this design does not have the capability to constrain undesirable lateral and twisting motions for imprint lithography.

Another prior art method is disclosed in U.S. Pat. No. 5,772,905 (the '905 Patent) by Stephen Y. Chou, which describes a lithographic method and apparatus for creating ultra-fine (sub-25 nm) patterns in a thin film coated on a substrate in which a mold having at least one protruding feature is pressed into a thin film carried on a substrate. The protruding feature in the mold creates a recess of the thin film. First, the mold is removed from the film. The thin film is then processed such that the thin film in the recess is removed exposing the underlying substrate. Thus, the patterns in the mold are replaced in the thin film, completing the lithography. The patterns in the thin film will be, in subsequent processes, reproduced in the substrate or in another material which is added onto the substrate.

The process of the '905 Patent involves the use of high pressures and high temperatures to emboss features on a material using micro molding. The use of high temperatures and pressures, however, is undesirable in imprint lithography since they result in unwanted stresses being placed on the device. For example, high temperatures cause variations in the expansion of the template and the substrate. Since the template and the substrate are often made of different materials, expansion creates serious layer-to-layer alignment problems. To avoid differences in expansion, the same material can be used but this limits material choices and increases overall costs of fabrication. Ideally, imprint lithography could be carried out at room temperatures and low pressures.

Moreover, the '905 Patent provides no details relative to the actual apparatus or equipment that would be used to achieve the process. In order to implement any imprint lithography process in a production setting, a carefully designed system must be utilized. Thus, a machine that can provide robust operation in a production setting is required. The '905 Patent does not teach, suggest or disclose such a system or a machine.

Another issue relates to separation of the template from the substrate following imprinting. Typically, due to the nearly uniform contact area at the template-to-substrate interface, a large separation force is needed to pull the layers apart. Such force, however, could lead to shearing and/or destruction of the features imprinted on the substrate, resulting in decreased yields.

In short, currently available orientation and overlay alignment methods are unsuitable for use with imprint lithography. A coupling between desirable orientation alignment and undesirable lateral motions can lead to repeated costly overlay alignment errors whenever orientation adjustments are required prior to printing of a field (a field could be for example a 1" by 1" region of an 8" wafer).

Further development of precise stages for robust implementation of imprint lithography is required for large-scale imprint lithography manufacturing. As such, a need exists for an improved imprint lithography process. A way of using imprint lithography as a fabrication technique without high pressures and high temperatures would provide numerous advantages.

SUMMARY OF THE INVENTION

A method to control a relative position between a surface and a body to form a pattern in the surface that features moving a body to obtain a desired relationship between the surface and the body. To that end, the method includes sensing the surface and the body and moving that body to obtain a desired spatial relationship with the surface. In this manner, distortions in the pattern may be minimized. These and other embodiments are discussed more fully below.

BRIEF DESCRIPTION OF THE DRAWINGS

The above objects and advantages, as well as specific embodiments, are better understood by reference to the following detailed description taken in conjunction with the appended drawings in which.

References in the figures correspond to those in the detailed description unless otherwise indicated.

DETAILED DESCRIPTION OF THE EMBODIMENTS

Without limiting the invention, it is herein described in connection with a system, devices, and related processes for imprinting very small features (sub-100 nanometer (nm) range) on a substrate, such as a semiconductor wafer, using methods of imprint lithography. It should be understood that the present invention can have application to other tasks, such as, for example, the manufacture of cost-effective Micro-Electro-Mechanical Systems (or MEMS), as well as various kinds of devices, including patterned magnetic media for data storage, micro optical devices, biological and chemical devices, X-ray optical devices, etc.

Figure 1A:
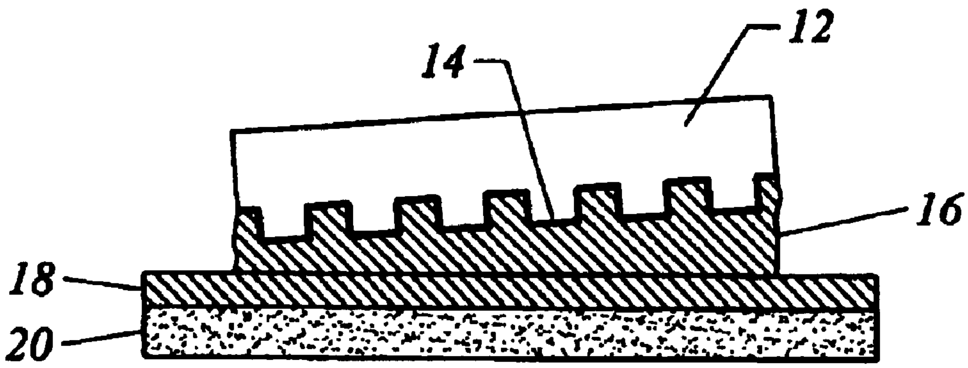
FIGS. 1A and 1B show undesirable gap between a template and a substrate.
Figure 1B:
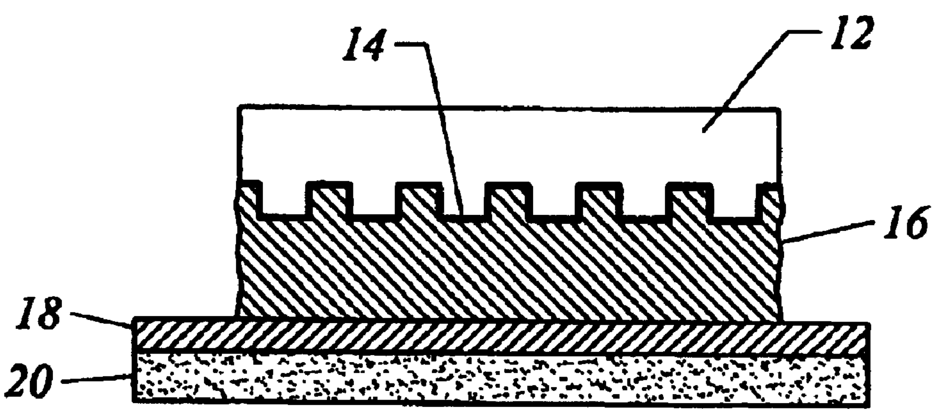

With reference now to the figures and specifically to FIGS. 1A and 1B, therein are shown arrangements of a template 12 predisposed with respect to a substrate 20 upon which desired features are to be imprinted using imprint lithography. Specifically, template 12 includes a surface 14 that has been fabricated to take on the shape of desired features which, in turn, are transferred to substrate 20. Between substrate 20 and template 12 lies a transfer layer 18, which receives the desired features from template 12 via an imprinted layer 16. As is well known in the art, transfer layer 18 allows one to obtain high aspect ratio structures (or features) from low aspect ratio imprinted features.

In FIG. 1A, a wedge-shaped imprinted layer 16 results so that template 12 is closer to substrate 20 at one end of imprinted layer 16. FIG. 1B shows imprinted layer 16 being too thick. Both of these conditions are highly undesirable. The present invention provides a system, processes and related devices for eliminating the conditions illustrated in FIGS. 1A and 1B, as well as other orientation problems associated with prior art lithography techniques.

Specifically, for the purpose of imprint lithography, it is necessary to maintain template 12 and substrate 20 as close to each other as possible and nearly parallel. This requirement is very stringent as compared to other proximity lithography techniques, such as proximity printing, contact printing, and X-ray lithography, as examples. Thus, for example, for features that are 100 nm wide and 100 nm deep, an average gap of about 200 nm or less with a variation of less than 50 nm across the imprinting area of substrate 20 is required for the imprint lithography process to be successful. The present invention provides a way of controlling the spacing between template 12 and substrate 20 for successful imprint lithography given such tight and precise gap requirements.

Figure 2A:
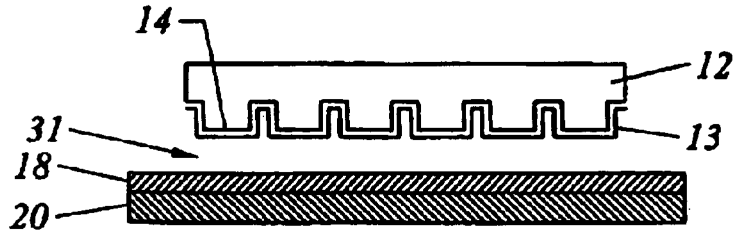
FIGS. 2A through 2E illustrate a version of the imprint lithography process according to the invention.
Figure 2B:
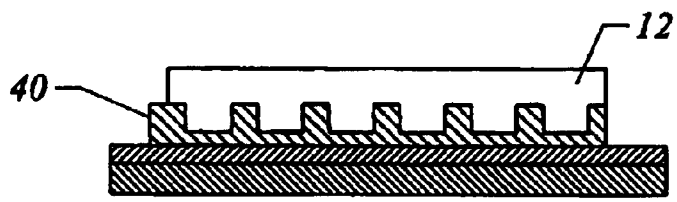

FIGS. 2A through 2E illustrate the process, denoted generally as 30, of imprint lithography according to the invention. In FIG. 2A, template 12 is orientated in spaced relation to substrate 20 so that a gap 31 is formed in the space separating template 12 and substrate 20. Surface 14 of template 12 is treated with a thin layer 13 to lower the template surface energy and to assist in separation of template 12 from substrate 20. The manner of orientation including devices for controlling gap 31 between template 12 and substrate 20 is discussed below. Next, in FIG. 2B, gap 31 is filled with a substance 40 that conforms to the shape of the treated surface 14. Essentially, substance 40 forms imprinted layer 16 shown in FIGS. 1A and 1B. Preferably, substance 40 is a liquid so that it fills the space of gap 31 rather easily without the use of high temperatures and gap 31 can be closed without requiring high pressures.

Figure 2C:
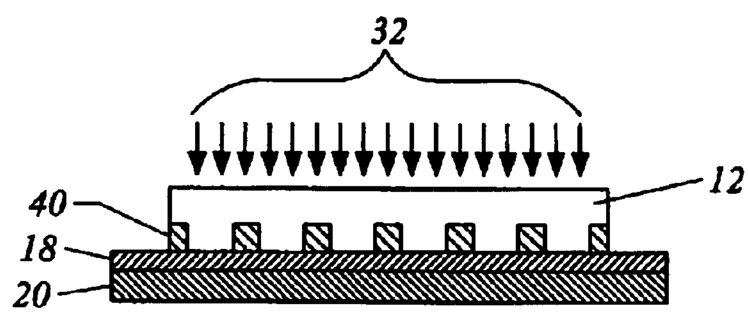

A curing agent 32, shown in FIG. 2C, is applied to template 12 causing substance 40 to harden and to assume the shape of the space defined by gap 31 between template 12 and substrate 20. In this way, desired features 44, shown in FIG. 2D, from template 12 are transferred to the upper surface of substrate 20. Transfer layer 18 is provided directly on the upper surface of substrate 20 which facilitates the amplification of features transferred from template 12 onto substrate 20 to generate high aspect ratio features.

Figure 2D:
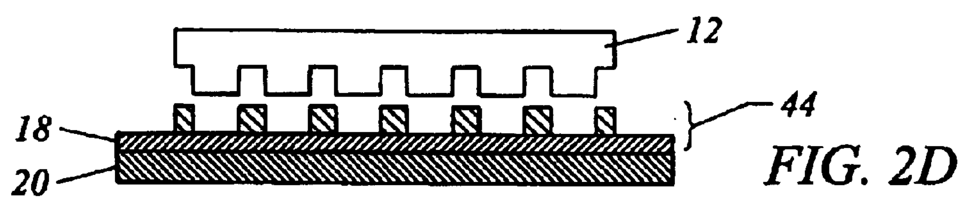

In FIG. 2D, template 12 is removed from substrate 20, leaving the desired features 44 thereon. The separation of template 12 from substrate 20 must be done so that desired features 44 remain intact without shearing or tearing from the surface of substrate 20. The present invention provides a method and an associated system for peeling and pulling (referred to herein as the "peel-and-pull" method) template 12 from substrate 20 following imprinting so the desired features 44 remain intact.

Figure 2E:
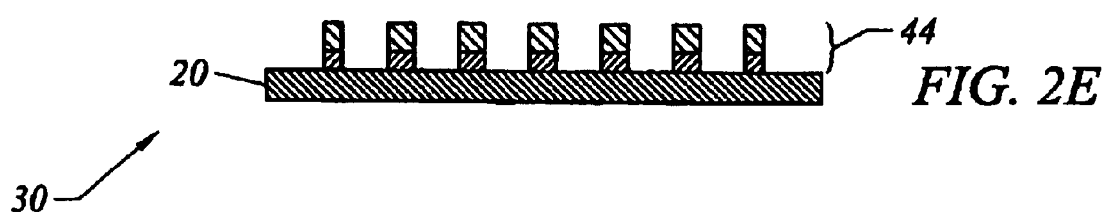
Figure 3:
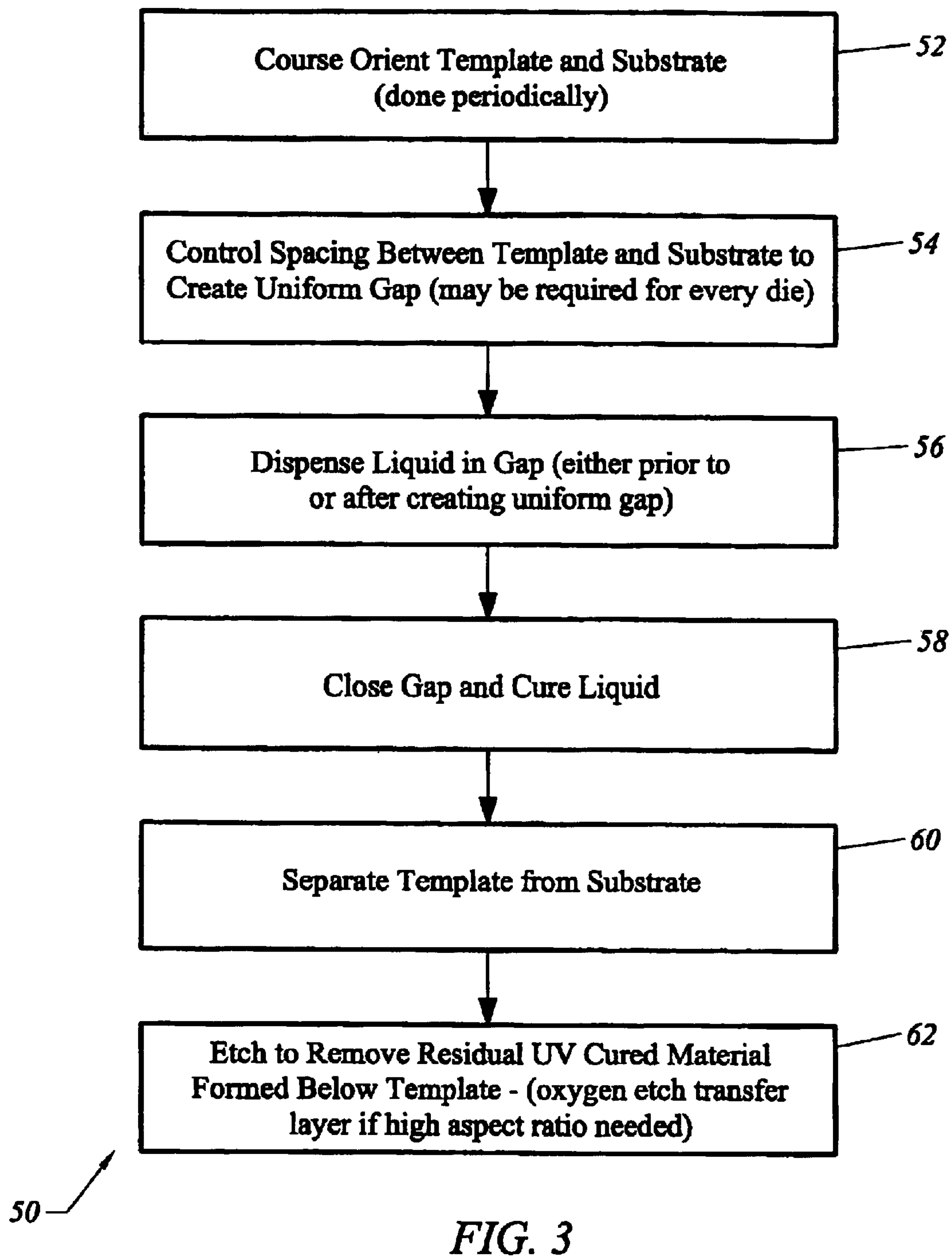
FIG. 3 is a process flow diagram showing the sequence of steps of the imprint lithography process of FIGS. 2A through 2E.

Finally, in FIG. 2E, features 44 transferred from template 12, shown in FIG. 2D, to substrate 20 are amplified in vertical size by the action of transfer layer 18, as is known in the use of bi-layer resist processes. The resulting structure can be further processed to complete the manufacturing process using well-known techniques. FIG. 3 summarizes the imprint lithography process, denoted generally as 50, of the present invention in flow chart form. Initially, at step 52, course orientation of a template and a substrate is performed so that a rough alignment of the template and the substrate is achieved. The advantage of course orientation at step 52 is that it allows pre-calibration in a manufacturing environment where numerous devices are to be manufactured with efficiency and with high production yields. For example, where the substrate comprises one of many die on a semiconductor wafer, course alignment (step 52) can be performed once on the first die and applied to all other dies during a single production run. In this way, production cycle times are reduced and yields are increased.

Next, at step 54, the spacing between the template and the substrate is controlled so that a relatively uniform gap is created between the two layers permitting the type of precise orientation required for successful imprinting. The present invention provides a device and a system for achieving the type of orientation (both course and fine) required at step 54. At step 56, a liquid is dispensed into the gap between the template and the substrate. Preferably, the liquid is a UV curable organosilicon solution or other organic liquids that become a solid when exposed to UV light. The fact that a liquid is used eliminates the need for high temperatures and high pressures associated with prior art lithography techniques.

At step 58, the gap is closed with fine orientation of the template about the substrate and the liquid is cured resulting in a hardening of the liquid into a form having the features of the template. Next, the template is separated from the substrate, step 60, resulting in features from the template being imprinted or transferred onto the substrate. Finally, the structure is etched, step 62, using a preliminary etch to remove residual material and a well-known oxygen etching technique is used to etch the transfer layer.

As discussed above, requirements for successful imprint lithography include precise alignment and orientation of the template with respect to the substrate to control the gap in between the template and the substrate. The present invention provides a system capable of achieving precise alignment and gap control in a production style fabrication process. Essentially, the system of the present invention provides a pre-calibration stage for performing a preliminary and a course alignment operation between the template and the substrate surface to bring the relative alignment to within the motion range of a fine movement orientation stage. This pre-calibration stage is required only when a new template is installed into the machine (also sometimes known as a stepper) and consists of a base plate, a flexure component, and three micrometers or higher resolution actuators that interconnect the base plate and the flexure component.

Figure 4:
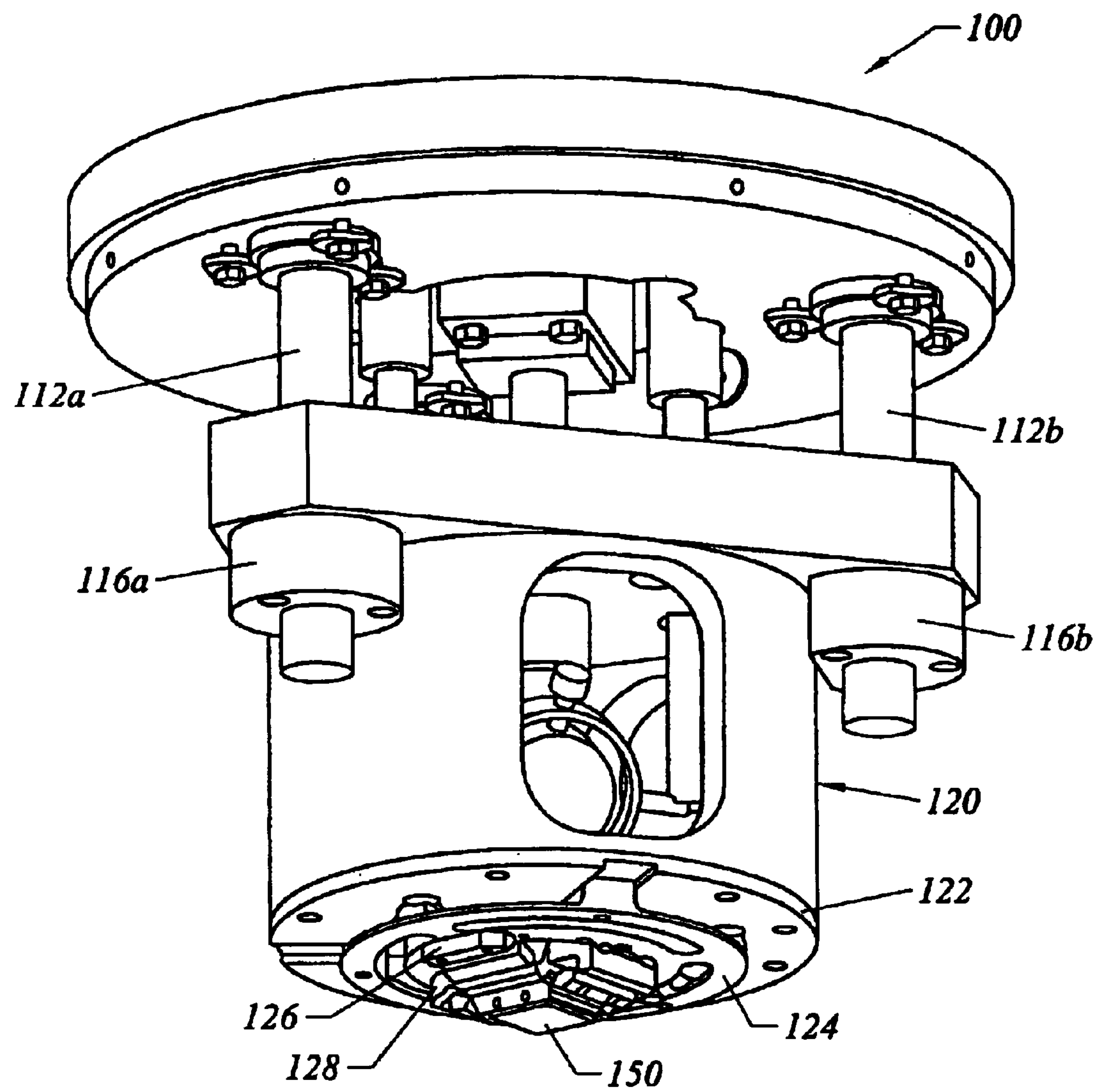
FIG. 4 shows an assembly of an orientation alignment and a gap control system, including both a course calibration stage and a fine orientation alignment and a gap control stage according to one embodiment of the invention.

With reference to FIG. 4, therein is shown an assembly of the system, denoted generally as 100, for calibrating and orienting a template, such as template 12, shown in FIG. 1A, about a substrate to be imprinted, such as substrate 20. System 100 can be utilized in a machine, such as a stepper, for mass fabrication of devices in a production type environment using the imprint lithography processes of the present invention. As shown, system 100 is mounted to a top frame 110 which provides support for a housing 120 which contains the pre-calibration stage for course alignment of a template 150 about a substrate (not shown in FIG. 4).

Housing 120 is seen coupled to a middle frame 114 with guide shafts 112*a* and 112*b* attached to middle frame 114 opposite housing 120. In one embodiment, three (3) guide shafts are used (the back guide shaft is not visible in FIG. 4) to provide a support for housing 120 as it slides up and down during vertical translation of template 150. This up-and-down motion of housing 120 is facilitated by sliders 116*a* and 116*b* which attach to corresponding guide shafts 112*a* and 112*b* about middle frame 114.

Figure 5:
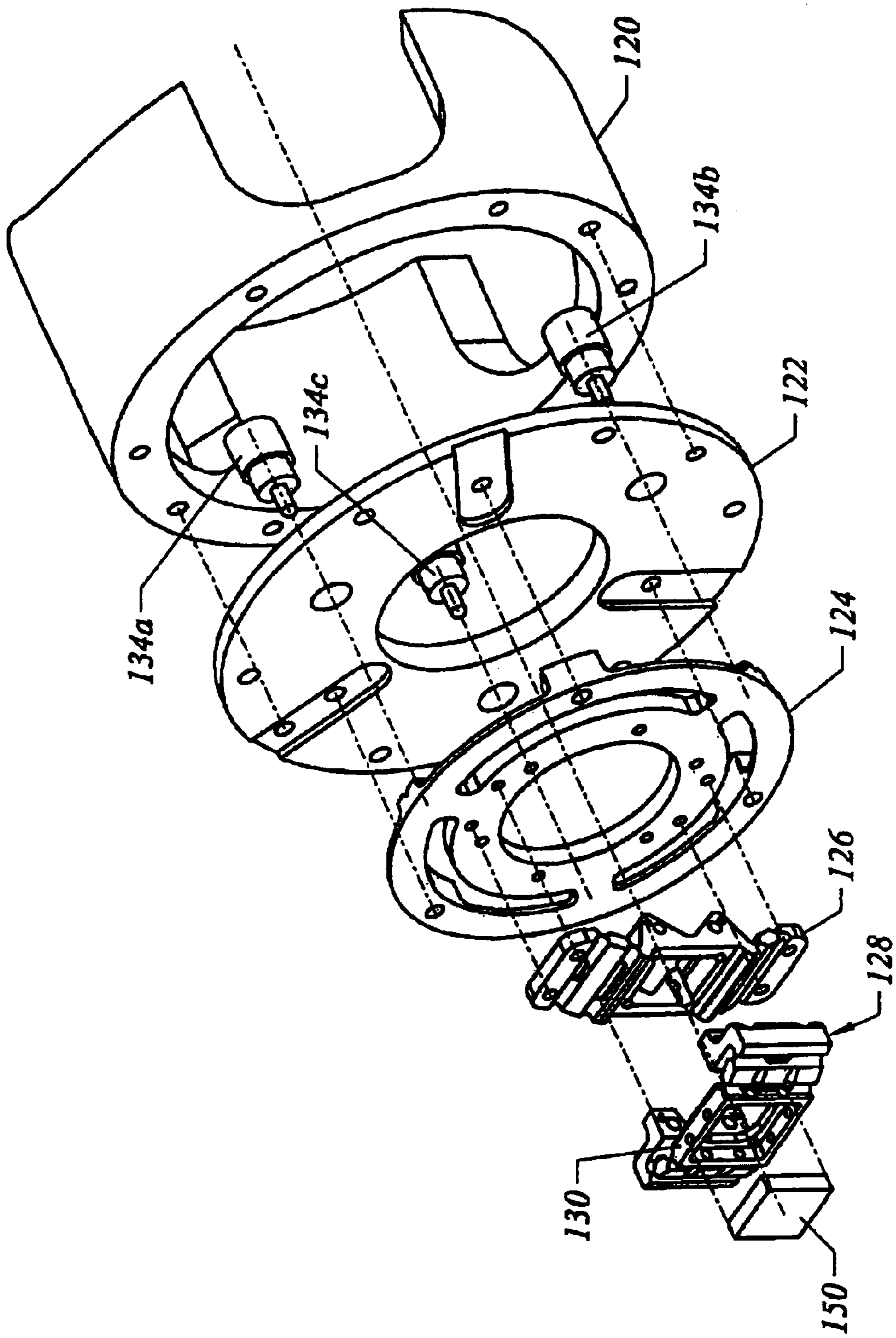
FIG. 5 is an exploded view of the system of FIG. 4.

System 100 includes a disk-shaped base plate 122 attached to the bottom portion of housing 120 which, in turn, is coupled to a disk-shaped flexure ring 124 for supporting the lower placed orientation stage comprised of first flexure member 126 and second flexure member 128. The operation and the configuration of flexure members 126 and 128 are discussed in detail below. In FIG. 5, second flexure member 128 is seen to include a template support 130, which holds template 150 in place during the imprinting process. Typically, template 150 comprises a piece of quartz with desired features imprinted on it, although other template substances may be used according to well-known methods.

As shown in FIG. 5, three (3) actuators 134*a*, 134*b* and 134*c* are fixed within housing 120 and are operably coupled to base plate 122 and flexure ring 124. In operation, actuators 134*a*, 134*b* and 134*c* would be controlled such that motion of flexure ring 124 is achieved. This allows for coarse pre-calibration. Actuators 134*a*, 134*b* and 134*c* can also be high resolution actuators which are equally spaced-apart about housing 120 permitting the additional functionality of very precise translation of flexure ring 124 in the vertical direction to control the gap accurately. In this way, system 100, shown in FIG. 4, is capable of achieving coarse orientation alignment and precise gap control of template 150 with respect to a substrate to be imprinted.

System 100 of the present invention provides a mechanism that enables precise control of template 150 so that precise orientation alignment is achieved and a uniform gap is maintained by the template with respect to a substrate surface. Additionally, system 100 provides a way of separating template 150 from the surface of the substrate following imprinting without shearing of features from the substrate surface. The precise alignment, the gap control and the separation features of the present invention are facilitated mainly by the configuration of first and second flexure members 126 and 128, respectively.

Figure 6A:
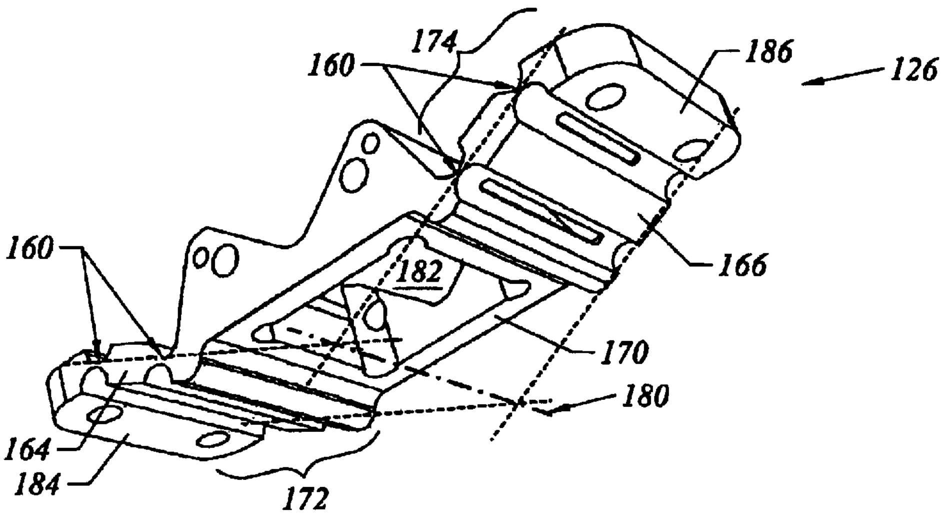
FIGS. 6A and 6B show first and second orientation sub-stages, respectively, in the form of first and second flexure members with flexure joints according to one embodiment of the invention.
Figure 6B:
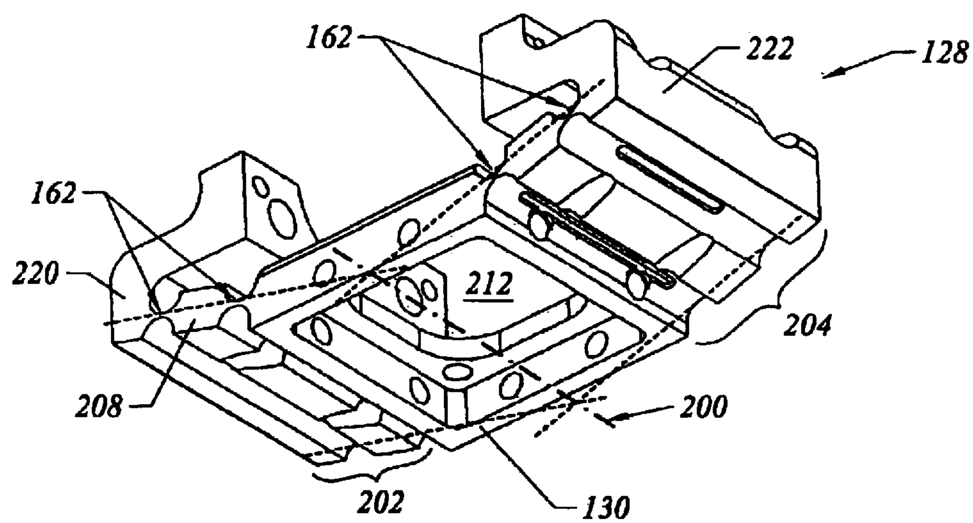

With reference to FIGS. 6A and 6B, therein are shown first and second flexure members 126 and 128, respectively, in more detail. Specifically, first flexure member 126 is seen to include a plurality of flexure joints 160 coupled to corresponding rigid bodies 164 and 166 which form part of arms 172 and 174 extending from a flexure frame 170. Flexure frame 170 has an opening 182, which permits the penetration of a curing agent, such as UV light, to reach template 150, shown in FIG. 5, when held in template support 130. As shown, four (4) flexure joints 160 provide motion of flexure member 126 about a first orientation axis 180. Flexure frame 170 of first flexure member 126 provides a coupling mechanism for joining with second flexure member 128, as illustrated in FIG. 7.

Likewise, second flexure member 12B, shown in FIG. 6B, includes a pair of arms 202 and 204 extending from a frame 206 and including flexure joints 162 and corresponding rigid bodies 208 and 210 which are adapted to cause motion of flexure member 128 about a second orientation axis 200. Template support 130 is integrated with frame 206 of second flexure member 128 and, like frame 170, shown in FIG. 6A, has an opening 212 permitting a curing agent to reach template 150, shown in FIG. 5, when held by template support 130.

Figure 7:
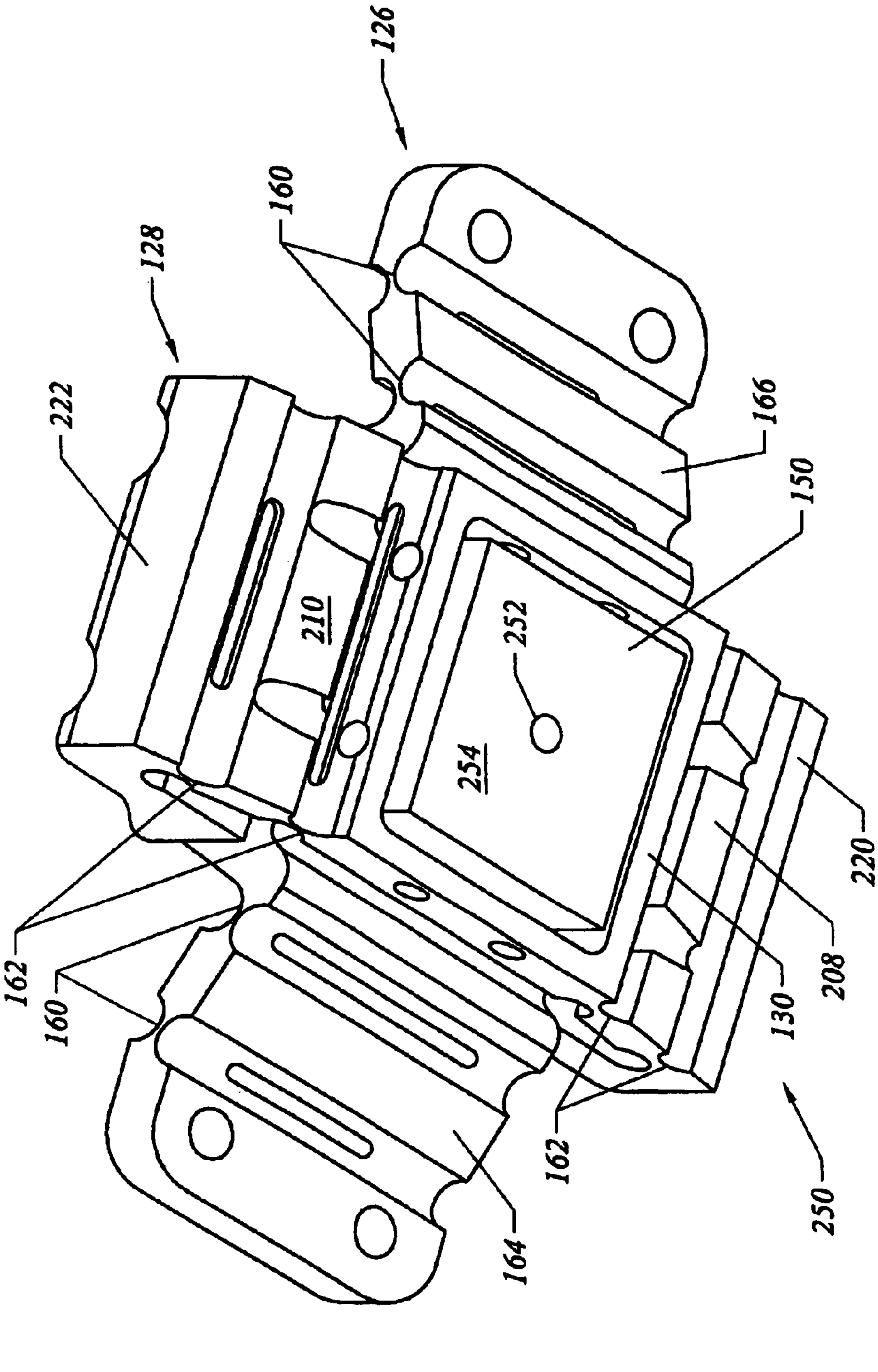
FIG. 7 shows the assembled fine orientation stage with first and second flexure members coupled to each other so that their orientation axes converge on a single pivot point.

In operation, first flexure member 126 and second flexure member 128 are joined, as shown in FIG. 7, to form the orientation stage 250 of the present invention. Braces 220 and 222 are provided in order to facilitate joining of the two pieces such that first orientation axis 180, shown in FIG. 6A, and second orientation axis 200, shown in FIG. 6B, are orthogonal to each other and intersect at a pivot point 252 at the template-substrate interface 254. The fact that first orientation axis 180 and second orientation axis 200 are orthogonal and lie on interface 254 provide the fine alignment and the gap control advantages of the invention. Specifically, with this arrangement, a decoupling of orientation alignment from layer-to-layer overlay alignment is achieved. Furthermore, as explained below, the relative position of first orientation axis 180 and second orientation axis 200 provides orientation stage 250 that can be used to separate template 150 from a substrate without shearing of desired features so that features transferred from template 150 remain intact on the substrate.

Referring to FIGS. 6A, 6B and 7, flexure joints 160 and 162 are notch-shaped to provide motion of rigid bodies 164, 166, 208 and 210 about pivot axes that are located along the thinnest cross section of the notches. This configuration provides two (2) flexure-based sub-systems for a fine decoupled orientation stage 250 having decoupled compliant orientation axes 180 and 200. The two flexure members 126 and 128 are assembled via mating of surfaces such that motion of template 150 occurs about pivot point 252 eliminating "swinging" and other motions that would destroy or shear imprinted features from the substrate. Thus, the fact that orientation stage 250 can precisely move template 150 about pivot point 252 eliminates shearing of desired features from a substrate following imprint lithography.

A system, like system 100, shown in FIG. 4, based on the concept of the flexure components has been developed for the imprinting process described above in connection with FIGS. 2A through 2E. One of many potential application areas is the gap control and the overlay alignment required in high-resolution semiconductor manufacturing. Another application may be in the area of single layer imprint lithography for next generation hard disk manufacturing. Several companies are considering such an approach to generate sub-100 nm dots on circular magnetic media. Accordingly, the invention is potentially useful in cost effective commercial fabrication of semiconductor devices and other various kinds of devices, including patterned magnetic media for data storage, micro optical devices, MEMS, biological and chemical devices, X-ray optical devices, etc.

Figure 8:
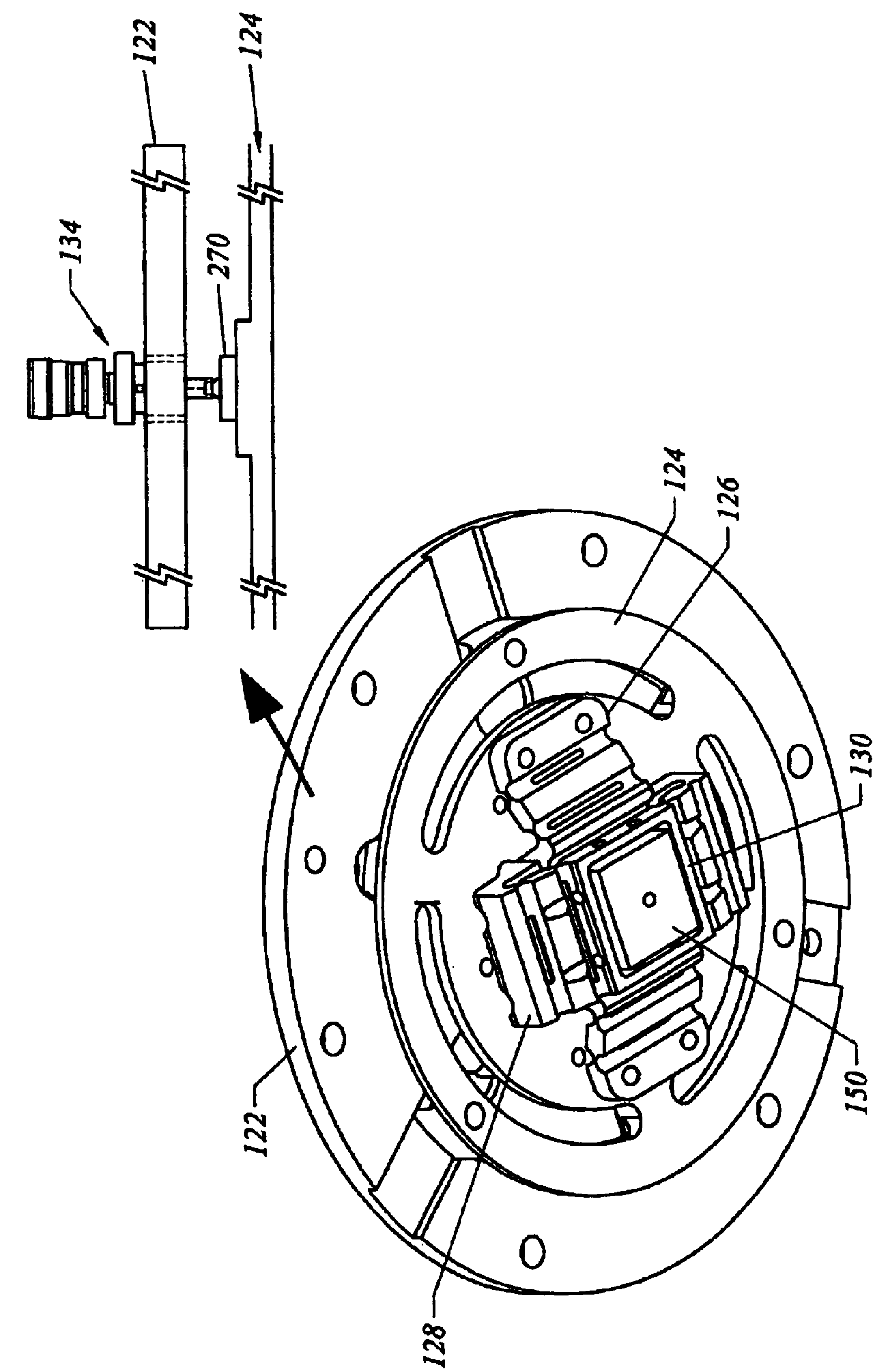
FIG. 8 is an assembly view of the course calibration stage (or pre-calibration stage) coupled to the fine orientation stage according to one embodiment.

Referring to FIG. 8, during operation of system 100, shown in FIG. 4, a Z-translation stage (not shown) controls the distance between template 150 and the substrate without providing orientation alignment. A pre-calibration stage 260 performs a preliminary alignment operation between template 150 and the wafer surfaces to bring the relative alignment to within the motion range limits of orientation stage 250, shown in FIG. 7. Pre-calibration is required only when a new template is installed into the machine.

Pre-calibration stage 260 is made of base plate 122, flexure ring 124, and actuators 134*a*, 134*b* and 134*c* (collectively 134) that interconnect base plate 122 and flexure ring 124 via load cells 270 that measure the imprinting and the separation forces in the Z-direction. Actuators 134*a*, 134*b* and 134*c* can be three differential micrometers capable of expanding and contracting to cause motion of base plate 122 and flexure ring 124. Alternatively, actuators 134 can be a combination of micrometer and piezo or tip-type piezo actuators, such as those offered by Physik Instruments, Inc.

Pre-calibration of template 150 with respect to a substrate can be performed by adjusting actuators 134, while visually inspecting the monochromatic light induced fringe pattern appearing at the interface of the template lower surface and the substrate top surface. Using differential micrometers, it has been demonstrated that two flat surfaces can be oriented parallel within 200 nm error across 1 inch using fringes obtained from green light.

Figure 9:
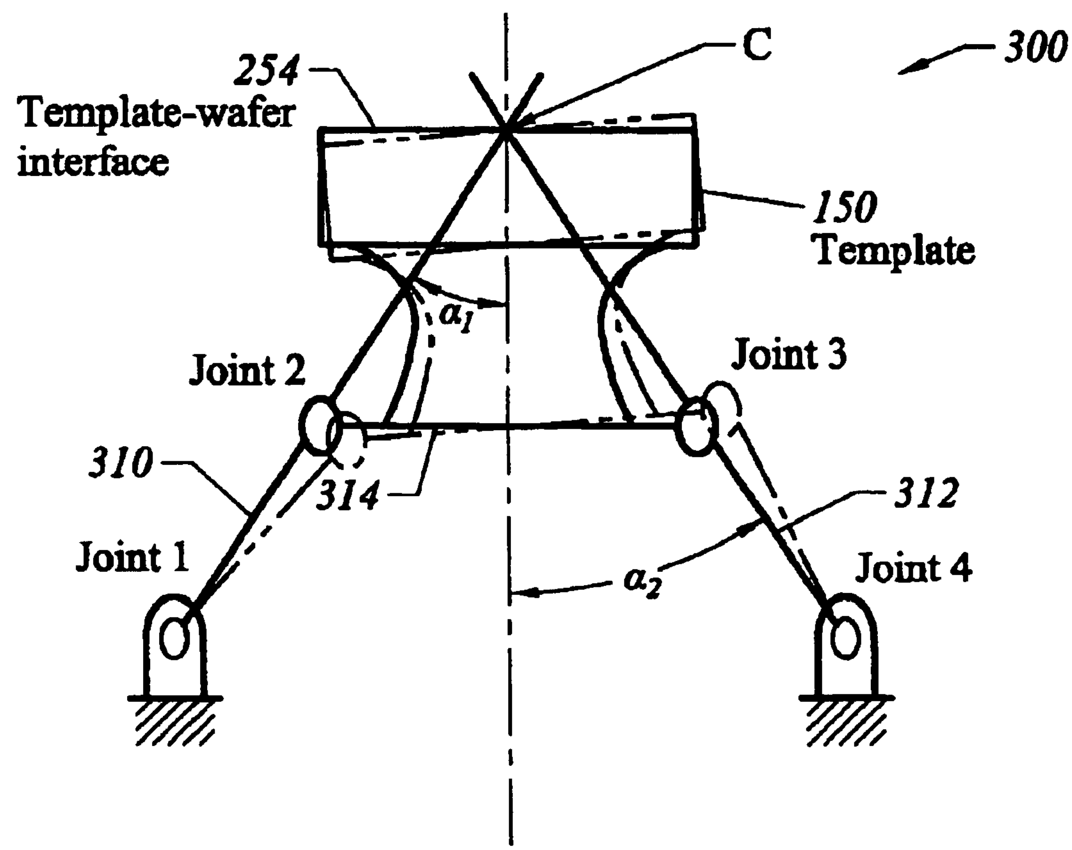
FIG. 9 is a simplified diagram of a 4-bar linkage illustrating the motion of flexure joints that results in an orientation axis.

With reference to FIG. 9, therein is shown a flexure model, denoted generally as 300, useful in understanding the principles of operation for a fine decoupled orientation stage, such as orientation stage 250 of FIG. 7. Flexure model 300 includes four (4) parallel joints—Joints 1, 2, 3 and 4—that provide a four-bar-linkage system in its nominal and rotated configurations. The angles $\alpha_1$ and $\alpha_2$ between the line 310 passing through Joints 1 and 2 and the line 312 passing through Joints 3 and 4, respectively, are selected so that the compliant alignment axis lies exactly on the template-wafer interface 254 within high precision machining tolerances (a few microns). For fine orientation changes, the rigid body 314 between Joints 2 and 3 rotates about an axis that is depicted by Point C. Rigid body 314 is representative of rigid bodies 164 and 208 of flexure members 126 and 128, shown in FIGS. 6A and 6B, respectively.

Since a similar second flexure component is mounted orthogonally onto the first one, as shown in FIG. 7, the resulting orientation stage 250 has two decoupled orientation axes that are orthogonal to each other and lie on template-substrate interface 254. The flexure components can be readily adapted to have openings so that a curing UV light can pass through template 150 as required in lithographic applications.

Orientation stage 250 is capable of fine alignment and precise motion of template 150 with respect to a substrate and, as such, is one of the key components of the present invention. The orientation adjustment, which orientation stage 250 provides ideally, leads to negligible lateral motion at the interface and negligible twisting motion about the normal to the interface surface due to selectively constrained high structural stiffness. The second key component of the invention is flexure-based members 126 and 128 with flexure joints 160 and 162 which provide for no particle generation and which can be critical for the success of imprint lithography processes.

This invention assumes the availability of the absolute gap sensing approach that can measure small gaps of the order of 200 nm or less between template 150 and the substrate with a resolution of a few nanometers. Such gap sensing is required as feedback if gap control is to be actively measured by use of actuators.

Figure 10:
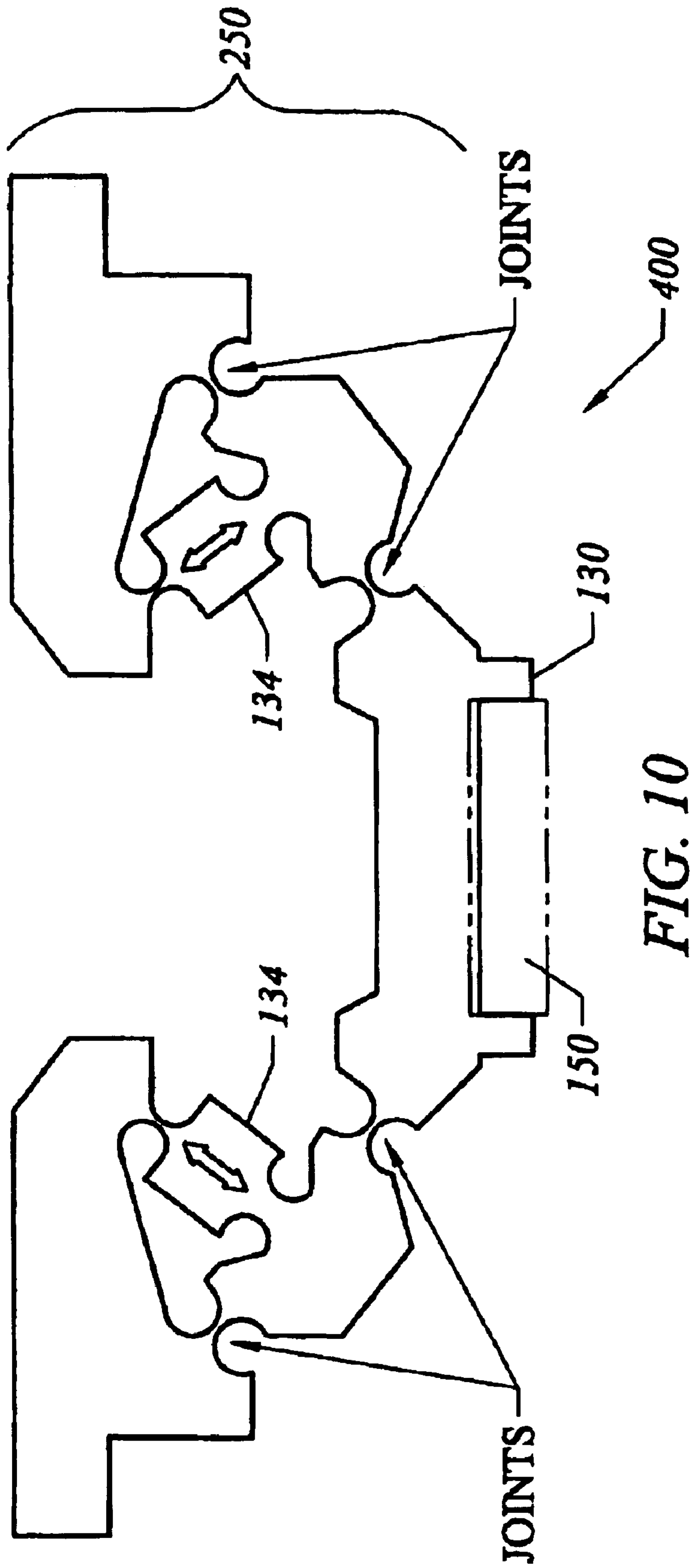
FIG. 10 illustrates a side view of the assembled orientation stage with piezo actuators.

FIG. 10 shows a configuration of orientation stage 250 with piezo actuators, denoted generally as 400. Configuration 400 generates pure tilting motions with no lateral motions at template-substrate interface 254, shown in FIG. 7. Therefore, a single overlay alignment step will allow the imprinting of a layer on the entire wafer. For overlay alignment, coupled motions between the orientation and the lateral motions lead to inevitable disturbances in X-Y alignment, which requires a complicated field-to-field overlay control loop.

Preferably, orientation stage 250 possesses high stiffness in the directions where side motions or rotations are undesirable and lower stiffness in directions where necessary orientation motions are desirable, which leads to a selectively compliant device. Therefore, orientation stage 250 can support relative high loads while achieving proper orientation kinematics between template 150 and the substrate.

Figure 12:
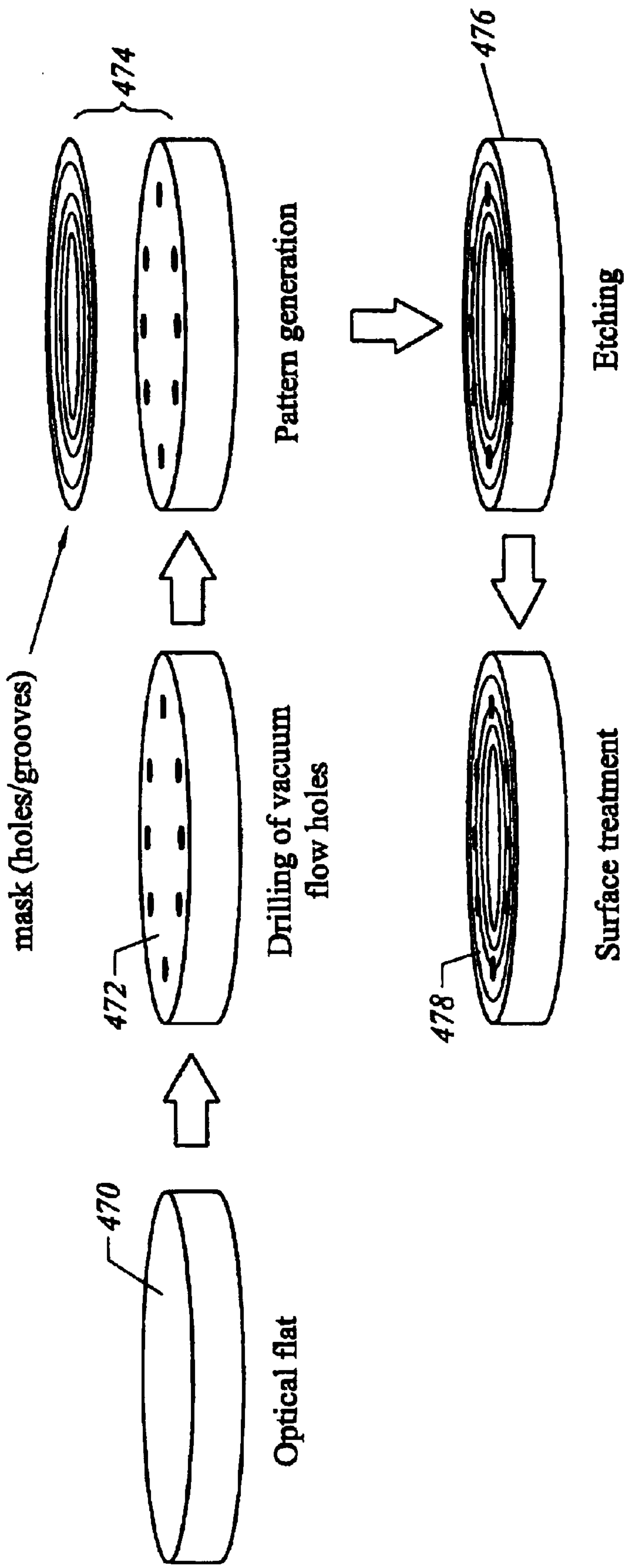
FIG. 12 illustrates the method for manufacturing a vacuum chuck of the types illustrated in FIGS. 11A and 11B.

With imprint lithography, a requirement exists that the gap between two extremely flat surfaces be kept uniform. Typically, template 150 is made from optical flat glass using electron beam lithography to ensure that it is substantially flat on the bottom. The wafer substrate, however, can exhibit a "potato chip" effect resulting in small micron-scale variations on its topography. The present invention provides a device, in the form of a vacuum chuck 478, as shown in FIG. 12, to eliminate variations across a surface of the wafer substrate that can occur during imprinting.

Figure 11A:
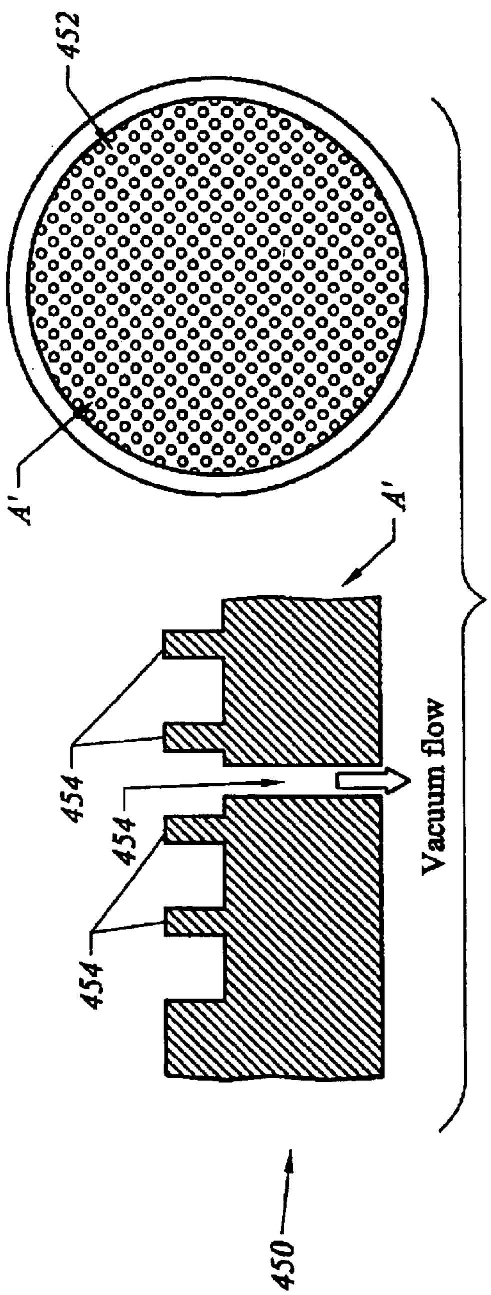
FIGS. 11A and 11B illustrate configurations for a vacuum chuck according to the invention.
Figure 11B:
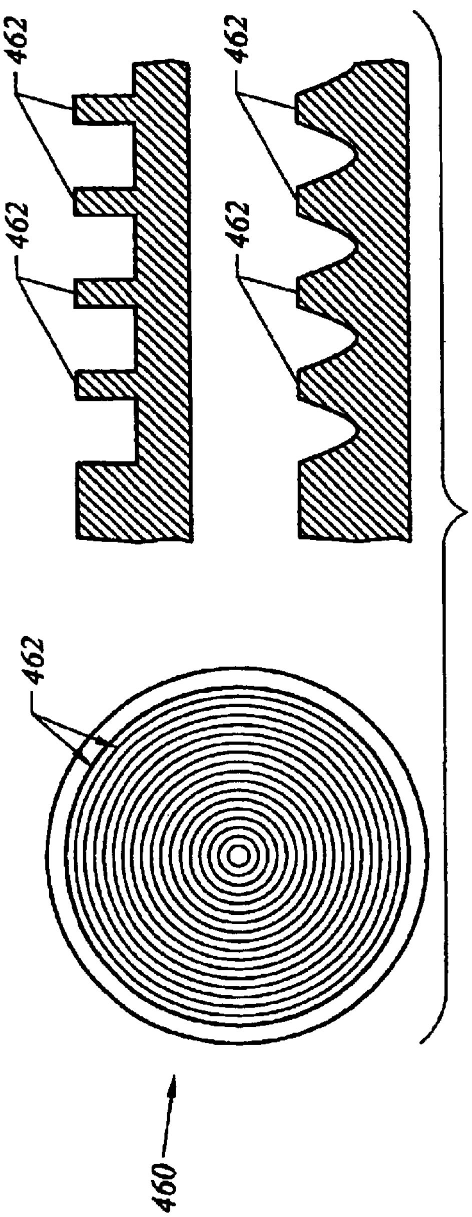

Vacuum chuck 478 serves two primary purposes. First, vacuum chuck 478 is utilized to hold the substrate in place during imprinting and to ensure that the substrate stays flat during the imprinting process. Additionally, vacuum chuck 478 ensures that no particles are present on the back of the substrate during processing. This is important to imprint lithography as particles can create problems that ruin the device and can decrease production yields. FIGS. 11A and 11B illustrate variations of a vacuum chuck suitable for these purposes according to two embodiments.

In FIG. 11A, a pin-type vacuum chuck 450 is shown as having a large number of pins 452 that eliminates the "potato chip" effect, as well as other deflections, on the substrate during processing. A vacuum channel 454 is provided as a means of pulling on the substrate to keep it in place. The spacing between pins 452 is maintained so the substrate will not bow substantially from the force applied through vacuum channel 454. At the same time, the tips of pins 452 are small enough to reduce the chance of particles settling on top of them.

Thus, with pin-type vacuum chuck 450, a large number of pins 452 are used to avoid local bowing of the substrate. At the same time, the pin heads should be very small since the likelihood of the particle falling in between the gaps between pins 452 can be high, avoiding undesirable changes in the shape of the substrate itself.

FIG. 11B shows a groove-type vacuum chuck 460 with grooves 462 across its surface. The multiple grooves 462 perform a similar function to pins 452 of pin-type vacuum chuck 450, shown in FIG. 11A. As shown, grooves 462 can take on either a wall shape 464 or have a smooth curved cross section 466. Cross section 466 of grooves 462 for groove-type vacuum chuck 460 can be adjusted through an etching process. Also, the space and the size of each groove 462 can be as small as hundreds of microns. Vacuum flow to each of grooves 462 can be provided typically through fine vacuum channels across multiple grooves that run in parallel with respect to the chuck surface. The fine vacuum channels can be made along with the grooves through an etching process.

FIG. 12 illustrates the manufacturing process for both pin-type vacuum chuck 450, shown in FIG. 11A, and groove-type vacuum chuck 460, shown in FIG. 11B. Using optical flats 470, no additional grinding and polishing steps are necessary for this process. Drilling at specified places of optical flats 470 produces vacuum flow holes 472 which are then masked and patterned (474) before etching (476) to produce the desired feature—either pins or grooves—on the upper surface of optical flat 470. The surface can then be treated (479) using well-known methods.

Figure 13A:
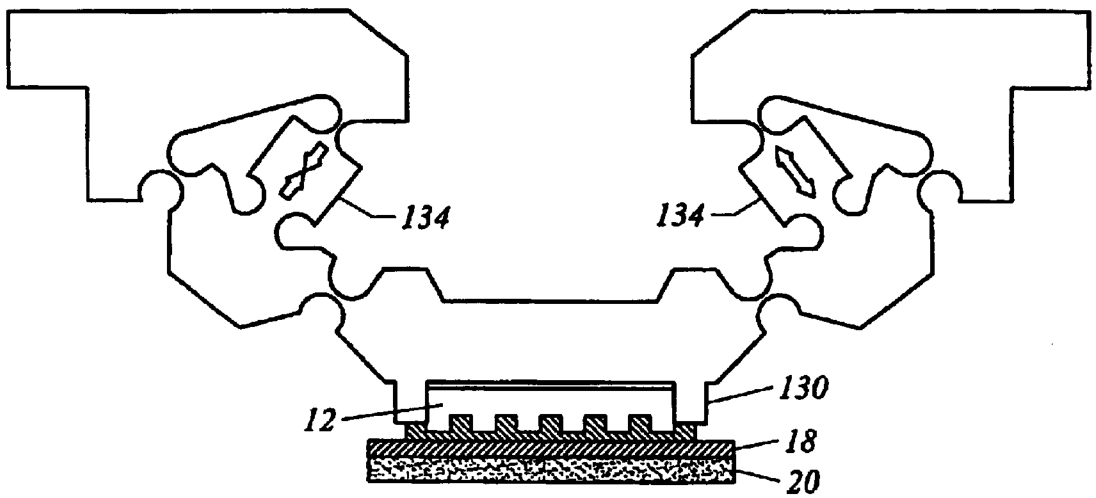
FIGS. 13A through 13C illustrate use of the fine orientation stage to separate a template from a substrate using the "peel-and-pull" method of the present invention.
Figure 13B:
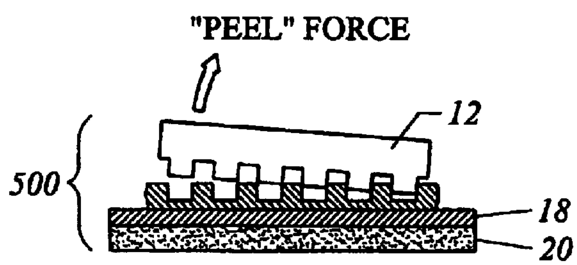
Figure 13C:
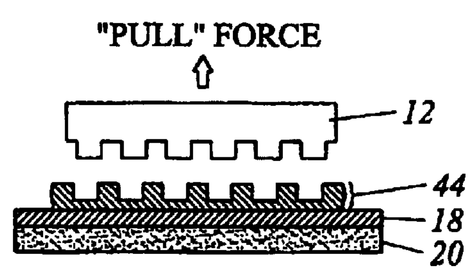

As discussed above, separation of template 150 from the imprinted layer is a critical and important final step of imprint lithography. Since template 150 and the substrate are almost perfectly oriented, the assembly of template 150, the imprinted layer, and the substrate leads to a uniform contact between near optical flats, which usually requires a large separation force. In the case of a flexible template or a substrate, the separation can be merely a "peeling process." However, a flexible template or a substrate is undesirable from the point of view of high-resolution overlay alignment. In the case of quartz template and silicon substrate, the peeling process cannot be implemented easily. The separation of the template from an imprinted layer can be performed successfully either by one of the two following schemes or the combination of them, as illustrated by FIGS. 13A, 13B and 13C.

For clarity, reference numerals 12, 18 and 20 will be used in referring to the template, the transfer layer and the substrate, respectively, in accordance with FIGS. 1A and 1B. After UV curing of substrate 20, either template 12 or substrate 20 can be tilted intentionally to induce a wedge 500 between template 12 and transfer layer 18 on which the imprinted layer resides. Orientation stage 250, shown in FIG. 10, of the present invention can be used for this purpose, while substrate 20 is held in place by vacuum chuck 478, shown in FIG. 12. The relative lateral motion between template 12 and substrate 20 can be insignificant during the tilting motion if the tilting axis is located close to the template-substrate interface, shown in FIG. 7. Once wedge 500 between template 12 and substrate 20 is large enough, template 12 can be separated from substrate 20 completely using Z-motion. This "peel and pull" method results in the desired features 44, shown in FIG. 2E, being left intact on transfer layer 18 and substrate 20 without undesirable shearing.

Figure 14A:
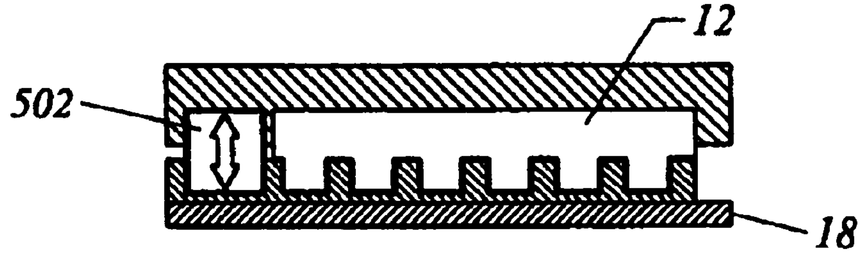
FIGS. 14A through 14C illustrate an alternative method of separating a template from a substrate using a piezo actuator.
Figure 14B:
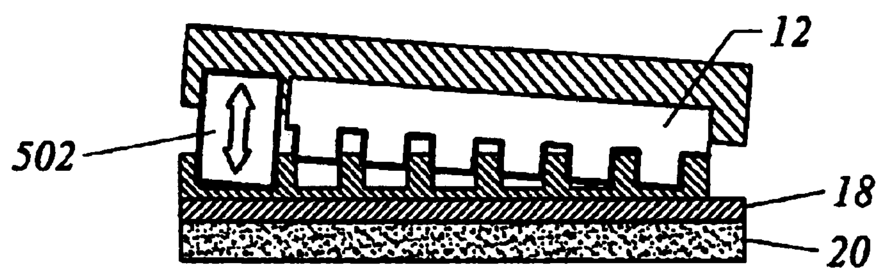
Figure 14C:
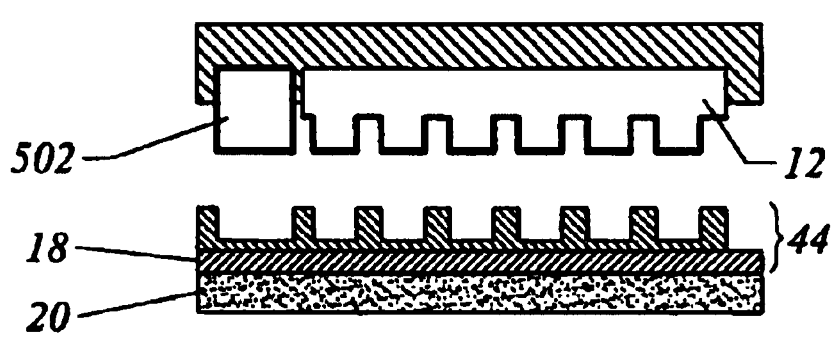

An alternative method of separating template 12 from substrate 20 without destroying the desired features 44 is illustrated by FIGS. 14A, 14B and 14C. One or more piezo actuators 502 are installed adjacent to template 12, and a relative tilt can be induced between template 12 and substrate 20, as shown in FIG. 14A. The free end of the piezo actuator 502 is in contact with substrate 20 so that when actuator 502 is enlarged, as shown in FIG. 14B, template 12 can be pushed away from substrate 20. Combined with a Z-motion between template 12 and substrate 20 (FIG. 14C), such a local deformation can induce a "peeling" and "pulling" effect between template 12 and substrate 20. The free end side of piezo actuator 502 can be surface treated similar to the treatment of the lower surface of template 12 in order to prevent the imprinted layer from sticking to the surface of piezo actuator 502.

In summary, the present invention discloses a system, processes and related devices for successful imprint lithography without requiring the use of high temperatures or high pressures. With the present invention, precise control of the gap between a template and a substrate on which desired features from the template are to be transferred is achieved. Moreover, separation of the template from the substrate (and the imprinted layer) is possible without destruction or shearing of desired features. The invention also discloses a way, in the form of suitable vacuum chucks, of holding a substrate in place during imprint lithography.

While this invention has been described with a reference to illustrative embodiments, the description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method to control a relative position between a surface and a body to form a pattern in said surface, said pattern comprising a plurality of protrusions and recessions, said method comprising:

sensing said relative position between said surface and said body; and moving said body to obtain a desired spatial relationship between said surface and said body while minimizing undesirable dimensional variations between said surface and said plurality of protrusions and said surface and said plurality of recessions.

2. The method as recited in claim 1 wherein said body extends in a first plane and said surface extends in a second plane, wherein moving further includes positioning said first plane parallel to said second plane.

3. The method as recited in claim 1 wherein sensing further includes detecting a fringe pattern produced by light impinging upon an interface of said body with said surface.

4. The method as recited in claim 1 wherein said body is coupled to be displaced along two orthogonal axes with a portion of said surface extending substantially parallel to a plane lying in said two orthogonal axes, wherein moving further includes displacing said body to lie parallel to said plane.

5. The method as recited in claim 1 further including coupling said body to move about first and second axes and decoupling movement of said body about said first and second axes so that movement about one of said first and second axes is substantially independent of movement about the remaining of said first and second axes.

6. The method as recited in claim 1 wherein said body is coupled to be displaced along two orthogonal axes, wherein moving further includes causing said body to undergo a displacement with respect to a subset of said two orthogonal axes, with said displacement being selected from a set of movements consisting of translation and rotation.

7. The method as recited in claim 1 further includes mounting said body to a flexure system having first and second axes of rotation and mounting said flexure system to an actuation system and moving said body with said actuation system to arrange said body to be substantially parallel to a portion of said surface in superimposition therewith.

8. The method as recited in claim 1 further including disposing a formable material on said surface and contacting said formable material with said body and measuring a force of said contact.

9. The method as recited in claim 1 wherein said body lies in a first plane and a portion of said surface lies in a second plane, with moving further including contacting said surface with said body and positioning said first plane parallel to said second plane before contacting said surface with said body.

10. A method to control a relative position between a surface and a body to form a pattern in said surface, said pattern comprising a plurality of protrusions and recessions, said method comprising:

sensing said relative position between said surface and said body;

moving said body to obtain a desired spatial relationship between said surface and said body while minimizing undesirable dimensional variations between said surface and said plurality of protrusions and said surface and said plurality of recessions; and after moving said body to obtain said desired spatial relationship, contacting said surface with said body.

11. The method as recited in claim 10 wherein sensing further includes detecting a fringe pattern produced by light impinging upon said body and said surface to sense said relative position.

12. The method as recited in claim 10 wherein said body extends in a first plane and a portion of said surface extends in a second plane, with moving further includes positioning said first plane parallel to said second plane.

13. The method as recited in claim 10 wherein said body is coupled to be displaced along two orthogonal axes with a portion of said surface extending substantially parallel to a plane lying in said two orthogonal axes, wherein moving further includes displacing said body to lie parallel to said plane.

14. The method as recited in claim 10 further including coupling said body to move about first and second axes and decoupling movement of said body about said first and second axes so that movement about one of said first and second axes is substantially independent of movement about the remaining of said first and second axes.

15. The method as recited in claim 10 wherein said body is coupled to be displaced along two orthogonal axis, wherein moving further includes causing said body to undergo a displacement with respect to a subset of two orthogonal axes, with said displacement being selected from a set of movements consisting of translation and rotation.

16. The method as recited in claim 10 further including mounting said body to a flexure system having a flexure member defining first and second axes of rotation and mounting said flexure system to an actuation system and moving said body with said actuation system body arrange said body to be substantially parallel to a portion of said surface in superimposition therewith.

17. A method to control a relative position between a surface and a body to form a pattern in said surface, said pattern comprising a plurality of protrusions and recessions, said method comprising:

sensing said relative position between said surface and said body by detecting a fringe pattern produced by light impinging upon said body and said surface; and moving said body to obtain a desired spatial relationship between said surface and said body while minimizing undesirable dimensional variations between said surface and said plurality of protrusions and said surface and said plurality of recessions.

18. The method as recited in claim 17 wherein said body is coupled to be displaced along two orthogonal axes with a portion of said surface extending substantially parallel to a plane lying in said two orthogonal axes, wherein moving further includes displacing said body to lie parallel to said plane.

19. The method as recited in claim 18 further including decoupling movement of said body with respect to said two orthogonal axes so that movement about one of said two axes is substantially independent of movement about the remaining of said two axes.

20. The method as recited in claim 19 wherein said movement is selected from a set of movements consisting of translation and rotation.

21. The method as recited in claim 20 further including mounting said body to a flexure system having first and second axes of rotation and mounting said flexure system to an actuation system and moving said body with said actuation system to arrange said body to be substantially parallel to a portion of said surface in superimposition therewith.

* * * * *